United States Patent [19]

Jehlicka

[11] 4,048,716

[45] Sept. 20, 1977

[54] METHOD OF MAKING ELECTRICAL CONNECTIONS

[75] Inventor: Roger F. Jehlicka, Highland Heights, Ohio

[73] Assignee: General Electric Company, Schenectady, N.Y.

[21] Appl. No.: 675,106

[22] Filed: Apr. 9, 1976

[51] Int. Cl.² .................. H01R 43/04; H01R 9/14; H01R 9/20

[52] U.S. Cl. ......................... 29/628; 29/626; 29/630 D; 240/1.3

[58] Field of Search .............. 29/628, 630 R, 630 D, 29/630 B, 626; 174/68.5; 317/101 CC, 101 DH, 101 F; 339/17 R; 354/126, 127, 148; 240/1.3, 103 R

[56] References Cited

U.S. PATENT DOCUMENTS

| | | | |
|---|---|---|---|
| 2,896,981 | 7/1959 | Cooney | 29/630 D X |
| 3,065,524 | 11/1962 | Donnell et al. | 29/630 D X |
| 3,233,034 | 2/1966 | Grabbe | 29/630 D UX |
| 3,445,929 | 5/1969 | Wolf | 29/630 D |
| 3,608,451 | 9/1971 | Kelem | 240/1.3 X |
| 3,894,226 | 7/1975 | Hanson | 240/1.3 |
| 3,925,596 | 12/1975 | Siden | 29/628 X |
| 3,927,471 | 12/1975 | Tricker | 29/625 |
| 3,935,442 | 1/1976 | Hanson | 240/1.3 |

Primary Examiner—Victor A. DiPalma
Attorney, Agent, or Firm—Norman C. Fulmer; Lawrence R. Kempton; Frank L. Neuhauser

[57] ABSTRACT

Eyelets are placed through openings from one side of a circuit board so as to make electrical connections with circuit runs on the board, wires are inserted through the eyelets, and portions of the eyelets extending from the other side of the board are bent over by wiping action of a tool so as to crimp the eyelets to the wires and secure the eyelets to the circuit board.

12 Claims, 8 Drawing Figures

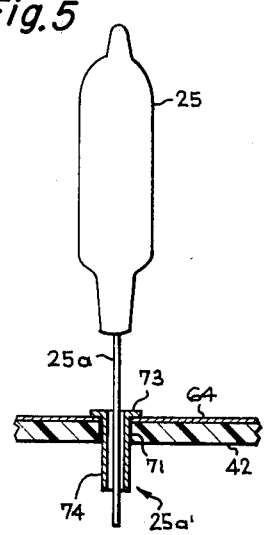
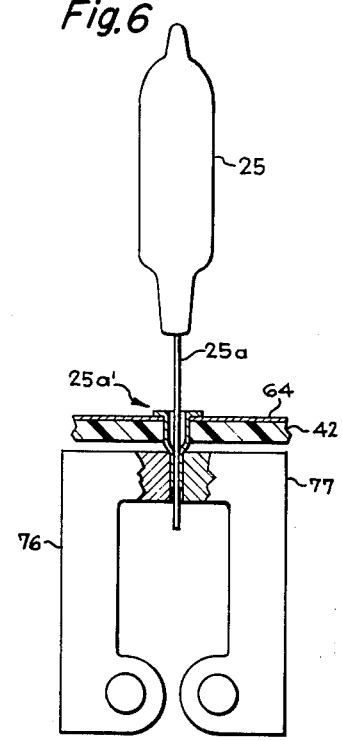
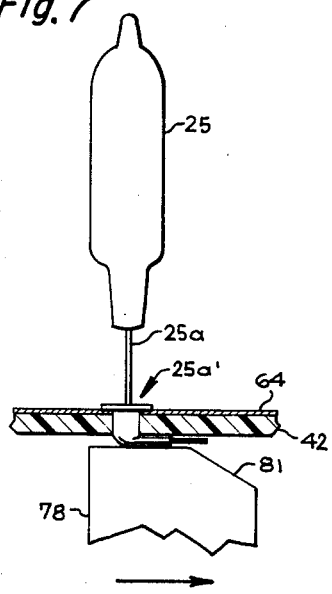
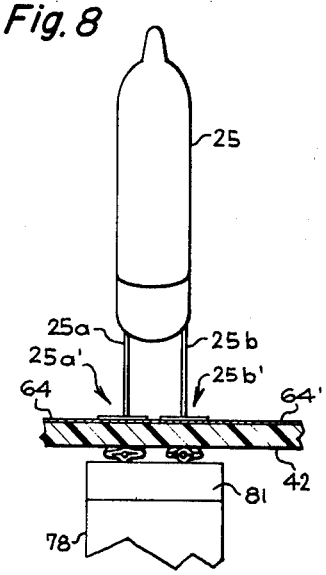

METHOD OF MAKING ELECTRICAL CONNECTIONS

CROSS-REFERENCES TO RELATED APPLICATIONS

Ser. No. 638,364, now U.S. Pat. No. 4,019,043, filed Dec. 8, 1975, Richard Blount, "Photoflash Lamp Array Having Shielded Switching Circuit," assigned the same as this invention.

Ser. No. 675,617, now U.S. Pat. No. 4,028,798, filed Apr. 9, 1976, Conrad E. Bechard, John M. Davenport, William H. Herrmann, and Steven N. Lovrekovic, "Method of Making Electrical Connections," assigned the same as this invention.

Ser. No. 686,145, now U.S. Pat. No. 4,036,578, filed May 13, 1976, Richard M. Herman, "Photoflash Array and Method of Construction," assigned the same as this invention.

BACKGROUND OF THE INVENTION

The invention is in the field of making electrical connections of wires and/or conductors, such as attaching wires to circuit runs of printed circuit boards.

Many methods have been used for interconnecting wires and/or conductors, such as twisting, soldering, welding, and by means of ultrasonic vibration bonding, and by means of fasteners such as screws, clamps, ferrules, eyelets, and rivets. The invention will be specifically described with respect to the attachment of photoflash lamp lead-in wires to circuit runs on a circuit board for use in the FlipFlash photoflash array. U.S. Pat. No. 3,935,442 to James M. Hanson describes a FlipFlash array construction in which the 16 lead-in wires of eight flash lamps of the array are connected to a circuit board by means of 16 eyelets. The eyelets are inserted in holes in the circuit board located so that the heads of the eyelets engage against circuit runs on the board. The flash lamp lead-in wires are inserted in the respective eyelets which are then crimped to hold the wires and make electrical contact.

SUMMARY OF THE INVENTION

Objects of the invention are to provide an economical and feasible method of connecting a wire or elongated conductor to a conductive member carried by a member of plastic or other suitable electrically insulative material.

The invention comprises, briefly and in a preferred embodiment, the method of connecting an elongated electrical conductive member to a conductor carried by an insulative member, comprising the steps of providing an opening through the insulative member at the conductor, placing an eyelet through the opening so as to be in contact with said conductor and extend from said insulative member, inserting said elongated conductive member into said eyelet, and bending the extending shank portion of the eyelet sideways so as to hold the elongated conductive member and secure the eyelet to the insulative member.

A particularly useful application for the invention is in connecting wires to circuit runs carried by a circuit board. For example, in the FlipFlash photoflash array, there are eight flash lamps having a total of 16 lead-in wires which must be electrically connected to various circuit runs carried by a circuit board. These connections are made securely and economically by the method of the invention.

BRIEF DESCRIPTION OF THE DRAWINGS

FIGS. 5, 6, 7, and 8 illustrate steps in the method of the invention for attaching flash lamp lead-in wires to a circuit board.

DESCRIPTION OF THE PREFERRED EMBODIMENTS

Figure 1:
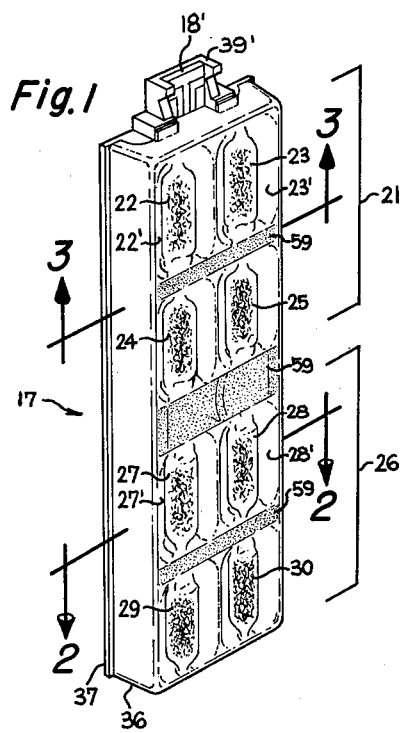
FIG. 1 is a perspective view of a multiple flash lamp array.

A multiple flash lamp unit 17 of the planar array type and containing a plurality of electrically fired flash lamps is provided with a plug-in connector tab 18 at the lower end thereof, adapted to fit into a socket of a camera or flash adapter as shown and described in patent applications referenced in the above-referenced Hanson patent. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect.

Figure 2:
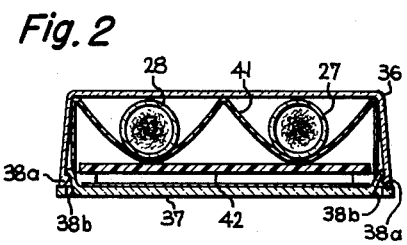
FIG. 2 is a sectional view taken on the line 2—2 of FIG. 1.
Figure 4:
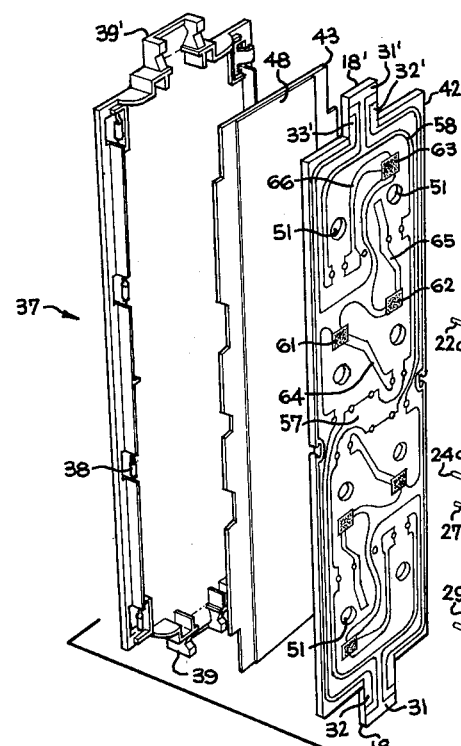
FIG. 4 is an exploded view of the array of FIG. 1.
Figure 4:
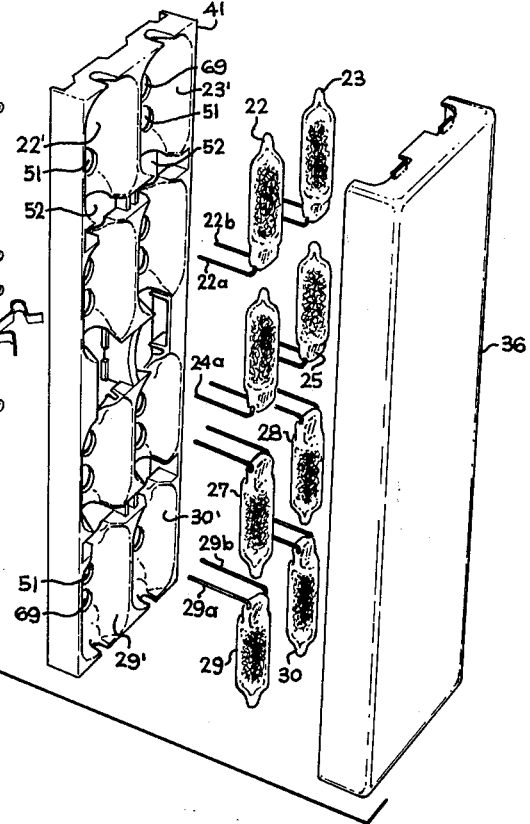

The general construction of the arrays, also disclosed in the above-referenced Hanson patent, comprises front and back housing members 36 and 37, which preferably are made of plastic and are provided with interlocking members 38 which can be molded integrally with the housing members and which lock the housing members together in final assembly to form a unitary flash array structure. FIG. 2 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and an indicia sheet 43 which may be provided with instructions, information, and other indicia such as flash indicators as described in the above-referenced Hanson patent. Openings 51 are provided through the reflector unit 41 and the circuit board 42 to facilitate radiation from flashing lamps reaching a flash indicator sheet 48 which changes color behind a flashed lamp. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pluse source and also to reduce the likelihood of lamps being accidentally flashed by electrostatic voltage when the array is handled.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., are attached to the circuit board 42 by means of metal eyelets 22a', 22b', etc., placed through openings in the board. The lead wires 22a, 22b, etc., pass through openings 52 in the reflector member 41 and into or through the respective pairs of eyelets 22a', 22b', etc., and, in accordance with the invention, the ends of the eyelets are crimped and bent sideways to hold the lead wires and make electrical contact thereto and also to hold the eyelets in place with their heads in electrical contact with the circuit of the circuit board. The method of accomplishing this will be described with reference to FIGS. 5–8.

A clip 56 is clipped onto the reflector member 41, which reflector preferably is made of metal-coated plastic, and the rear of the clip 56 rests in touching contact against an area 57 of an electrical ground circuit run 58 on the board and which includes the terminals 31 and 31' and which makes contact with one of the connector eyelets 22a', or 22b', etc., for each of the lamps 22, etc., whereby the reflector unit 41 additionally functions as an electrically grounded shield.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

Figure 3:
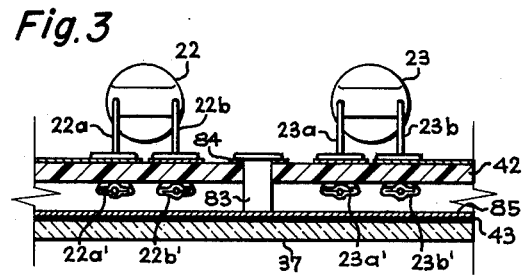
FIG. 3 is a partial sectional view taken on the line 3—3 of FIG. 1.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 3 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 1000 volts for example, at low current, for flashing, and they can be fired by impacting or stressing a piezoelectric element in the camera, as disclosed in U.S. Pat. Nos. 2,972,937 and 3,106,080 to C. G. Suits.

A preferred method of carrying out the invention, illustrated in FIGS. 5–8, comprises the steps of providing a circuit board 42 of electrically insulating material and carrying a conductor such as a circuit run 64 on a first side thereof, providing an opening 71 through the board at or adjacent to the conductor 64, and inserting an eyelet 72 of metal or other conductive material through the opening 71 from said first side of the board so that the head 73 of the eyelet contacts against the conductor 64 and the shank 74 of the eyelet extends from the other side of the board. An elongated conductor such as a lead-in wire 25a of a flash lamp 25 is inserted into or through the eyelet 72, as shown in FIG. 5. An optional step, shown in FIG. 6, consists of crimping and flattening the extending eyelet shank against the lead-in wire 25a, such as by means of a pair of opposed jaws 76, 77. Then, in accordance with the invention, the eyelet shank 74 is bent over sideways and preferably against or adjacent to the underside of the circuit board, such as by a sideways wiping action of a tool 78 (FIG. 7) moving in the direction of the arrow 79 while the board is held in position. The leading edge of the tool may be beveled as indicated at 81 to facilitate initial bending of the eyelet. FIG. 8 is a 90° rotated view of FIG. 7, showing the pair of lead-in wires 25a and 25b secured to a pair of conductors 64 and 64' on the circuit board 42 by means of a pair of eyelets 25a' and 25b'. The eyelets for all of the lead-in wires of all of the flash lamps can be "wiped" over by a single pass of the tool 78, or a plurality of tools 78 can be employed for wiping the lead-in wires and eyelets of individual lamps or of groups of lamps. If desired, the tool or tools 78 can be fixedly positioned and the board can be moved over them. The eyelet shanks need not be bent completely sideways, but should be bent at least 45°. The optional crimping step of FIG. 6 need not be employed if the eyelet shank wall is sufficiently thin with relationship to its length so that the shank will become crimped while being bent in the step of FIG. 7. If the optional crimping and flattening of the eyelet shank is utilized (per FIG. 6), the wiping action of FIG. 7 should be done in a direction against a flat side of the eyelet shank so that it can be bent over easily.

Wiping the eyelet shanks sideways in accordance with the invention pulls and holds the eyelet heads 73 in secure electrical contact against the circuit board conductors, and performs the final crimping, or entire crimping, of the eyelet shanks against the lead-in wires for providing secure electrical and mechanical connections. Also, the invention permits the use of longer-shank eyelets for increasing the contact area with the lead-in wires and thus improving the electrical and mechanical connection without requiring increased clearance space behind the circuit board. As a further advantage of the invention, it is unnecessary to trim off ends of lead-in wires extending from the eyelet shanks. As shown in FIG. 3, the bent-over shanks of the eyelets, such as 22a', 22b', 23a', and 23b' permit the circuit board 42 to be positioned near to the back 37 of the housing, resulting in a compact construction. A straight eyelet 83 is positioned through the circuit board 42 at an electrical ground circuit run 84 and engages against a metal shield coating 85 carried on the indicia sheet 43, and holds the metal-coated indicia sheet in position, as is disclosed in the above-referenced Blount patent application.

As is explained above, the invention is particularly useful in attaching wires to conductors of a circuit board, such as attaching lead-in wires of flash lamps to a circuit board.

While preferred embodiments and modifications of the invention have been shown and described, various other embodiments and modifications thereof will become apparent to persons skilled in the art, and will fall within the scope of the invention as defined in the following claims.

What I claim as new and desire to secure by Letters Patent of the U.S. is:

1. A method of connecting an elongated electrical conductive member to a conductor carried by an electrically insulative member, comprising the steps of providing an opening through said insulative member at said conductor, placing an eyelet through said opening so as to make contact with said connector and so that the shank of the eyelet extends from the insulative member, inserting said elongated conductive member into said eyelet, and bending the entire end region of the extending shank of the eyelet sufficiently sideways so as to hold the conductive member and secure the eyelet in position.

2. A method as claimed in claim 1, in which said eyelet shank is bent at least 45° sideways.

3. A method as claimed in claim 1, in which said eyelet shank is bent by a wiping action of a tool against and over the shank.

4. A method as claimed in claim 3, in which said tool has a leading edge which is beveled to facilitate bending of the eyelet shank.

5. A method as claimed in claim 1, in which said insulative member is a circuit board and said conductor is a circuit run on a surface of the circuit board, said eyelet being inserted through the circuit board from said surface thereof so that the head of the eyelet contacts against said circuit run.

6. A method as claimed in claim 1, including the step of crimping and flattening said eyelet shank prior to the bending step.

7. A method as claimed in claim 6, in which said eyelet shank is bent by a wiping action of a tool against and over a flat side of the flattened shank.

8. A method of connecting a pair of lead-in wires of a photoflash lamp to a pair of circuit runs carried on a side of a circuit board, comprising the steps of providing a pair of openings through said circuit board respectively at said circuit runs, placing a pair of eyelets through said openings, respectively so that the heads of the eyelets respectively contact against said circuit runs and the shanks of the eyelets extend from the other side of the circuit board, inserting said lead-in wires respectively into said eyelets from the head ends thereof, and bending the entire end regions of the extending shanks of the eyelets sufficiently sideways so as to hold the lead-in wires and secure the eyelets in position.

9. A method as claimed in claim 8, in which said eyelet shanks are bent simultaneously sideways at least 45° in the same direction by a wiping action of a tool against and over said shanks.

10. A method as claimed in claim 9, in which said tool has a leading edge which is beveled to facilitate bending of the eyelet shanks.

11. A method as claimed in claim 8, including the step of crimping and flattening said eyelet shanks prior to the bending step.

12. A method as claimed in claim 11, in which the eyelet shanks are flattened so as to lie in a common plane, and in which said shanks are bent simultaneously sideways at least 45° in the same direction by a wiping action of a tool against and over flat sides of said flattened shanks.

* * * * *